United States Patent [19]

Shakuda

[11] Patent Number: 5,548,127
[45] Date of Patent: Aug. 20, 1996

[54] SEMICONDUCTOR LIGHT EMITTING DEVICE AND ITS MANUFACTURING METHOD

[75] Inventor: Yukio Shakuda, Kyoto, Japan

[73] Assignee: Rohm Co., Ltd., Kyoto, Japan

[21] Appl. No.: 255,933

[22] Filed: Jun. 7, 1994

[30] Foreign Application Priority Data

Jun. 8, 1993 [JP] Japan .................................. 5-137133
Jun. 8, 1993 [JP] Japan .................................. 5-137134
Jun. 8, 1993 [JP] Japan .................................. 5-137135

[51] Int. Cl.$^6$ .................................................. H01L 29/161
[52] U.S. Cl. .......................... 257/13; 257/86; 257/94; 257/97; 257/102
[58] Field of Search ...................... 257/13, 86, 94, 257/97, 102

[56] References Cited

U.S. PATENT DOCUMENTS 4,719,497  1/1988  Tsai .
5,371,756 12/1994  Fujii ............................................ 257/13

FOREIGN PATENT DOCUMENTS 60-178684  9/1985  Japan .
1187885    7/1989  Japan .
3161982    7/1991  Japan .
5218565    8/1993  Japan .

OTHER PUBLICATIONS

Gallium Arsnide and Related Compounds 1991, No. 120, 9–12 Sep. 1991, pp. 9–16 M. A. Hasse et al. "Short wavelength II–VI laser diodes" p. 11 paragraph 2–p. 12; Figures 1, 2.

Primary Examiner—Edward Wojciechowicz
Attorney, Agent, or Firm—Nikaido, Marmelstein, Murray & Oram LLP

[57] ABSTRACT

In a light emitting device made of a group II–VI semiconductor, a P-type interface film including one or two layers is formed between the positive electrode and the uppermost P-type layer of the group II–VI semiconductor film, to make the energy band increase in steps from the electrode to the semiconductor film, thereby realizing a structure where the current flows at a low voltage. The II–VI semiconductor film is MBE-grown at a substrate temperature of 350° C. or below. The P-type interface film is formed to have a carrier concentration of $10^{19}/cm^3$ or above by MBE growth at a substrate temperature lower than or equal to the substrate temperature at which the semiconductor film is formed.

6 Claims, 5 Drawing Sheets

8: N-TYPE SEMICONDUCTOR LAYER
9: P-TYPE SEMICONDUCTOR LAYER

8: N-TYPE SEMICONDUCTOR LAYER
9: P-TYPE SEMICONDUCTOR LAYER

SEMICONDUCTOR LIGHT EMITTING DEVICE AND ITS MANUFACTURING METHOD

BACKGROUND OF THE INVENTION

1. Field of the Invention

The present invention relates to a semiconductor light emitting device and its manufacturing method, said light emitting device being used as a semiconductor laser device, as a blue light emitter which is one of the elements of a display panel for use in displays of various electronic apparatuses, as a blue light emitting device (LED) used individually in a display apparatus, as a signal reading and writing light emitting device for use in a compact disk (CD) player, a laser disk (LD) player and a magnetic optical disk player, and as a light emitting device for use in a bar code reader.

2. Description of the Prior Art

FIG. 1 schematically shows the basic structure of a semiconductor laser device which is a kind of such a semiconductor light emitting device, and the condition of a corresponding energy band. The general structure of the semiconductor laser device is as follows: a semiconductor film B is formed on the surface of an N-type semiconductor substrate A by MBE (molecular beam epitaxy)-growing an N-type semiconductor layer $B_1$, an active layer $B_2$ and a P-type semiconductor layer $B_3$ in this order, and light is emitted from the active layer $B_2$ by applying a bias voltage in a forward direction between a metal electrode $E_1$ formed on the reverse surface of the substrate A and a metal electrode $E_2$ formed on the obverse surface of the P-type semiconductor layer $B_3$ which is the top surface of the semiconductor film B, i.e. from the electrode $E_2$ to the electrode $E_1$.

As well known, the energy band of the semiconductor laser device of the above-described structure is of a configuration such that the energy levels of the N-type semiconductor layer $B_1$ and the P-type semiconductor layer $B_3$ are high and that an energy level trough is formed at the active layer $B_2$ which is a P-N junction. An energy barrier $\Delta V$ is generated between the electrodes $E_1$ and $E_2$ and the semiconductor film B.

Therefore, when a voltage necessary to obtain a current I which causes holes h to go over the energy barrier $\Delta V$ is applied between the electrodes $E_1$ and $E_2$, the carriers i.e. holes h and electrons injected by the voltage application are shut up in the active layer $B_2$ where the energy level is low, so that an induced emission occurs vigorously. When the exciting current exceeds a threshold value, light resonates between the parallel end surfaces of the active layer $B_2$ to cause a laser oscillation.

FIG. 2 shows an example of a more specific structure of a conventional semiconductor laser device. The device shown in this figure is what is called a blue light emitting semiconductor layer of ZnSe in which an N-type GaAs substrate 21 is used as the N-type semiconductor substrate and a group II–VI semiconductor film 22 of ZnCdSSe or MgZnCdSSe is formed on the substrate 21 as the semiconductor film.

The group II–VI semiconductor film 22 is formed by MBE-growing an N-type ZnSe layer 23 which is a buffer layer, an N-type ZnSSe layer 24 which is a clad layer, a ZnCdSe layer 25 which is an active layer, a P-type ZnSSe layer 26 which is a clad layer and a P-type ZnSe layer 27 which is a buffer layer in this order on the substrate 21. A metal such as Au is directly deposited onto the P-type ZnSe layer 27 which is the top layer of the group II–VI semiconductor film to form a positive electrode 28. Reference numeral 29 represents a negative electrode formed on the reverse surface of the substrate 21.

In the semiconductor laser device of the above-described conventional structure, the metal electrode 28 is directly formed on the P-type ZnSe layer 27. However, it is known that when the P-type semiconductor of ZnSe is directly joined to a metal, a Schottky-type voltage/current characteristic exists therebetween.

Specifically, in the conventional structure, as is shown in the energy band configuration of FIG. 3, when a bias voltage is applied in a forward direction between the electrodes 28 and 29, a steep Schottky-type energy barrier $\Delta V$ is generated between the metal electrode 28 and the P-type ZnSe layer 27 forming the outermost layer of the group II–VI semiconductor film 22. For this reason, a current which causes the holes h to go over the energy barrier $\Delta V$ cannot be obtained unless a considerably high voltage is applied.

Therefore, in the conventional structure, since not only the power required to drive the device increases but also a current of several amperes flows in the device, the current density in the device is very high, so that it is inevitable for the device to generate heat while being driven. Thus, in the conventional device, in addition to the increase in power consumption, it is difficult to operate the device at ordinary temperature because of the possibility of thermal breakdown.

To solve these problems, it is necessary for the device to have a structure where currents flow easily from the metal electrode 28 to the group II–VI semiconductor film 22 so that the bias voltage applied between the electrodes 28 and 29 may be as low as possible. To do so, for example, after the electrode 28 is formed, the group II–VI semiconductor film 22 may be maintained at a temperature higher than its growth temperature.

Specifically, the MBE growth of the group II–VI semiconductor film 22 on the substrate 21 is performed normally at a substrate temperature of 350° or below. After the metal electrode 28 is deposited onto the group II–VI semiconductor film 22, the semiconductor film 22 is heated again to a temperature (e.g. approximately 400° C.) higher than the growth temperature so that the metal constituting the electrode 28 is diffused into the group II–VI semiconductor film 22.

Since the inclination of the energy barrier $\Delta V$ is gentler as shown by the broken line of FIG. 3 when the metal is diffused into the P-type ZnSe layer 27 which is the top layer of the group II–VI semiconductor film 22, the current flows more easily. However, the group II–VI semiconductor film 22 has the property of increasing in electric resistance when heated to a temperature higher than the growth temperature.

For this reason, it is difficult under the present circumstances to perform the alloying by diffusing the electrode metal into the P-type ZnSe layer 27 while maintaining the electric resistance of the ZnSe layer 27 to be low. Therefore, to obtain the necessary current, a high voltage must be applied between the electrodes 28 and 29 like in the above-described conventional structure. Thus, the problems cannot be solved by this method.

As another solution, a Group II–VI semiconductor film 22 having a high carrier concentration of $10^{19}/cm^3$ or above may be Grown on the substrate 21. According to this method, since the energy band of the P-type ZnSe layer 27 shifts to decrease the energy barrier as shown by the alternate long and short dash line of FIG. 3, a structure in which the current flows easily is realized. However, under the present circumstances, it is technically next to impossible to obtain a P-type Group II–VI semiconductor film having such a high carrier concentration.

SUMMARY OF THE INVENTION

An object of the present invention is to improve the temperature characteristic of the whole semiconductor light emitting device by decreasing the power consumption and heat Generation by improving the voltage/current characteristic between the P-type Group II–VI semiconductor film and the electrode so that a necessary current flows at a low voltage.

To achieve the above-mentioned object, in a semiconductor light emitting device where a semiconductor film including an N-type semiconductor layer, an active layer and a P-type semiconductor layer which are arranged in this order in lamination is formed on a GaAs substrate, the semiconductor film is made of a Group II–VI semiconductor of ZnCdSSe or MgZnCdSSe, and a P-type interface film is formed between a positive electrode and the P-type semiconductor layer which is the top layer of the semiconductor film. The P-type interface film is of two layer structure including a P-type AlGaAs film and a P-type GaAs film or a P-type GaAs film and a P-type InGaAs film, or of one layer structure including a P-type GaAs film or a P-type InGaAs film. Preferably, the P-type interface film has a carrier concentration of $10^{19}$/cm$^3$ or above.

According to the structure described above, the gap of the energy band between the positive electrode and the semiconductor film is divided into three or two steps by the P-type interface film formed therebetween, and the Schottky-type energy barrier is reduced. As a result, the voltage necessary to obtain a current which causes the holes to go over the energy barrier between the positive electrode and the P-type layer which is the top layer of the semiconductor film is very low compared to the conventional structure. Further, since the P-type interface film has a high carrier concentration, the semiconductor film is capable of conducting a large quantity of current.

The method of forming the semiconductor light emitting device of the present invention is as follows: First, the N-type semiconductor layer, the active layer and the P-type semiconductor layer are MBE-grown in this order to form the group II-VI semiconductor film of ZnCdSSe or MgZnCdSSe on the GaAs substrate while the temperature of the substrate is maintained at 350° C. or below. Then, on the P-type semiconductor layer which is the top layer of the group II–VI semiconductor film, a P-type interface film is formed through MBE growth. At this time, the GaAs substrate is set at a temperature lower than or equal to the substrate temperature at which the group II–VI semiconductor film is formed. When the P-type interface film having two layers of a P-type AlGaAs film and a P-type GaAs film is formed, the P-type AlGaAs film is formed first, and then, the P-type GaAs film is formed thereon. When the P-type having two layers of a P-type GaAs film and a P-type InGaAs film is formed, the P-type GaAs film is formed first, and then, the P-type InGaAs film is formed thereon.

According to the manufacturing method described above, since the P-type interface film is formed at a low temperature, the deterioration of the group II–VI semiconductor film is prevented.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 4:
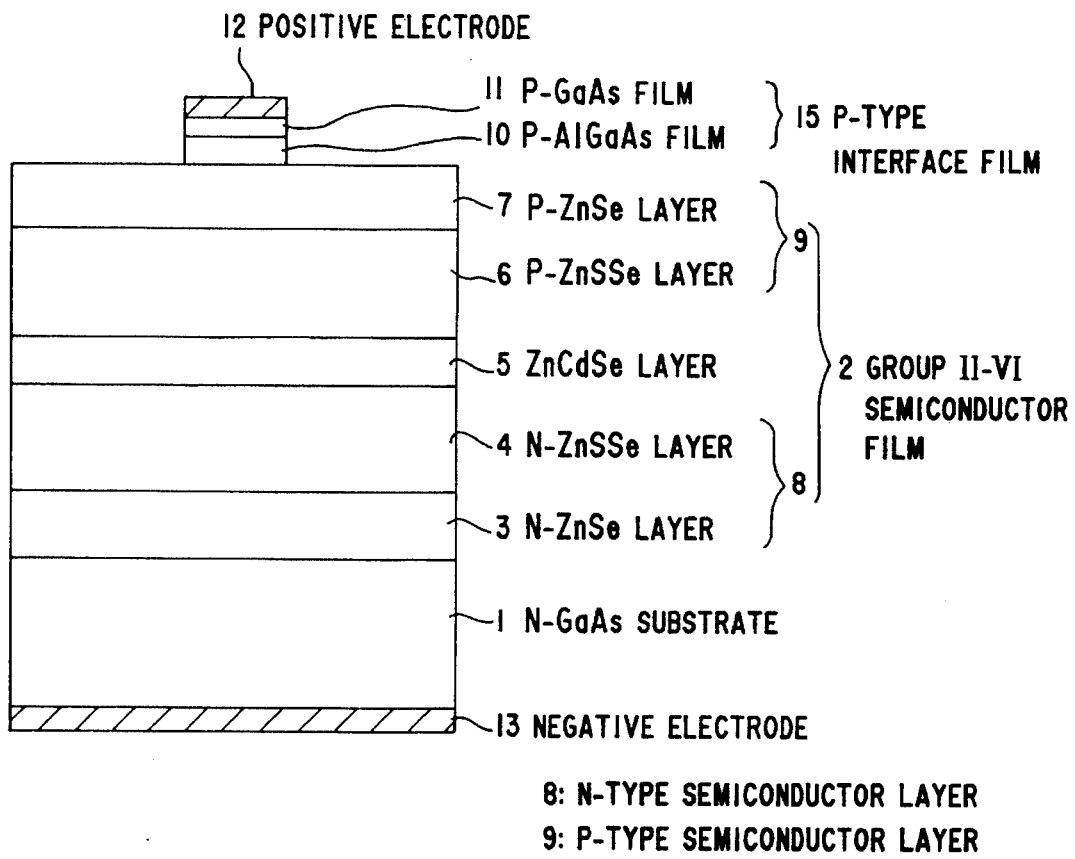
FIG. 4 is a front cross-sectional view schematically showing the structure of a first embodiment of the present invention.

Hereinafter, embodiments of the present invention employed in a semiconductor laser device will be described with reference to the drawings. FIG. 4 schematically shows the structure of a first embodiment. The device shown in this figure is a blue light emitting semiconductor laser in which a group II–VI semiconductor film 2 of ZnCdSSe is formed on an N-type GaAs substrate 1.

The group II–VI semiconductor film 2 is formed by MBE-growing an N-type ZnSe layer 3 which is a buffer layer, an N-type ZnSSe layer 4 which is a clad layer, a ZnCdSe layer 5, a P-type ZnSSe layer 6 which is a clad layer and a P-type ZnSe layer 7 which is a buffer layer in this order on the N-type GaAs substrate 1. The ZnCdSe layer 5 serving as the active layer is sandwiched at a P-N junction between an N-type semiconductor layer 8 including the N-type ZnSe layer 3 and the N-type ZnSSe layer 4, and the P-type semiconductor layer 9 including the P-type ZnSSe layer 6 and the P-type ZnSe layer 7.

Between the group II–VI semiconductor film 2 and a positive electrode 12, a P-type interface film 15 including two P-type films is formed. Specifically, a P-type AlGaAs film 10 is formed on the P-type ZnSe layer 7 through MBE growth, and a P-type GaAs film 11 is formed on the P-type AlGaAs film 10 through MBE growth. A metal such as Au is deposited onto the P-type GaAs film 11 to form the positive electrode 12. Reference numeral 13 represents a negative electrode, which is formed by depositing a metal such as Au onto the reverse surface of the N-type GaAs substrate 1 like the positive electrode 12.

Figure 5:
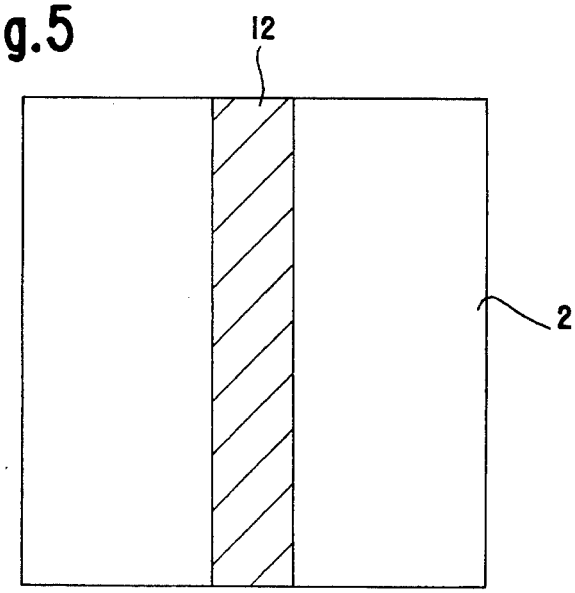
FIG. 5 is a plan view schematically showing the structure of the first embodiment.

In this embodiment, as shown in the plan view of FIG. 5, the positive electrode 12 and the P-type interface film 15 are formed to be of a belt shape having a constant width to prevent the current diffusion so that the current effectively contributes to the light emission. However, the configurations of the positive electrode 12 and the P-type interface film 15 are not limited to the belt shape.

In this structure, when a bias voltage is applied in a forward direction between the positive and negative electrodes 12 and 13, i.e. from the positive electrode 12 to the negative electrode 13, the current flows from the positive electrode 12 to the group II–VI semiconductor film 2 by way of the P-type interface film 15 including the P-type GaAs film 11 and the P-type AlGaAs film 10. This current causes the holes to go over the energy barrier between the positive electrode 12 and the group II–VI semiconductor film 2 to flow from the P-type semiconductor layer 9 into the ZnCdSe layer 5 which is an active layer. The electrons flow from the N-type semiconductor layer 8 to the ZnCdSe layer 5.

By the injection of the carriers, the recombination occurs of the electrons and holes which are shut up in the ZnCdSe layer 5 where the energy level is low, so that natural light is emitted from the ZnCdSe layer 5. When the exciting current exceeds a threshold value, the light emission of the ZnCdSe layer 5 is changed from the natural light emission to an induced emission, so that light resonates between the parallel end surfaces of the ZnCdSe layer 5 to cause a laser oscillation.

Figure 6:
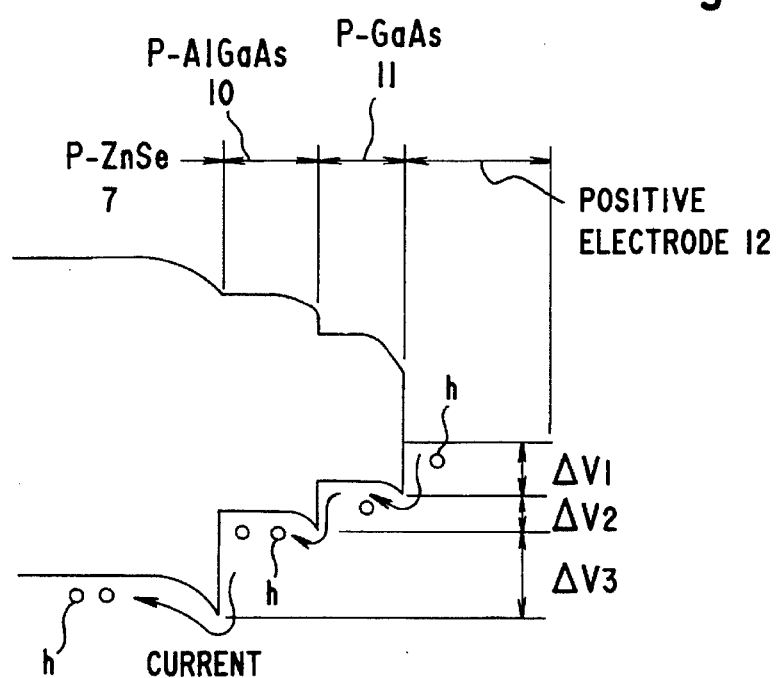
FIG. 6 is a characteristic diagram showing the energy band at the connection between a positive electrode and a semiconductor in the first embodiment.

FIG. 6 shows the condition of the energy band in this embodiment. As shown in the figure, the energy band gap of each layer compared to the positive electrode 12 increases in the following order: the P-type GaAs film 11< the P-type AlGaAs film 10< the P-type ZnSe layer 7 of the group II–VI semiconductor film 2. Therefore, the energy barrier between the positive electrode 12 and the P-type ZnSe layer 7 is divided into three steps. The potential differences are $\Delta V_1$ between the positive electrode 12 and the P-type GaAs film 11, $\Delta V_2$ between the P-type GaAs film 11 and the P-type AlGaAs film 10, and $\Delta V_3$ between the P-type AlGaAs film 10 and the P-type ZnSe layer 7.

Figure 2:
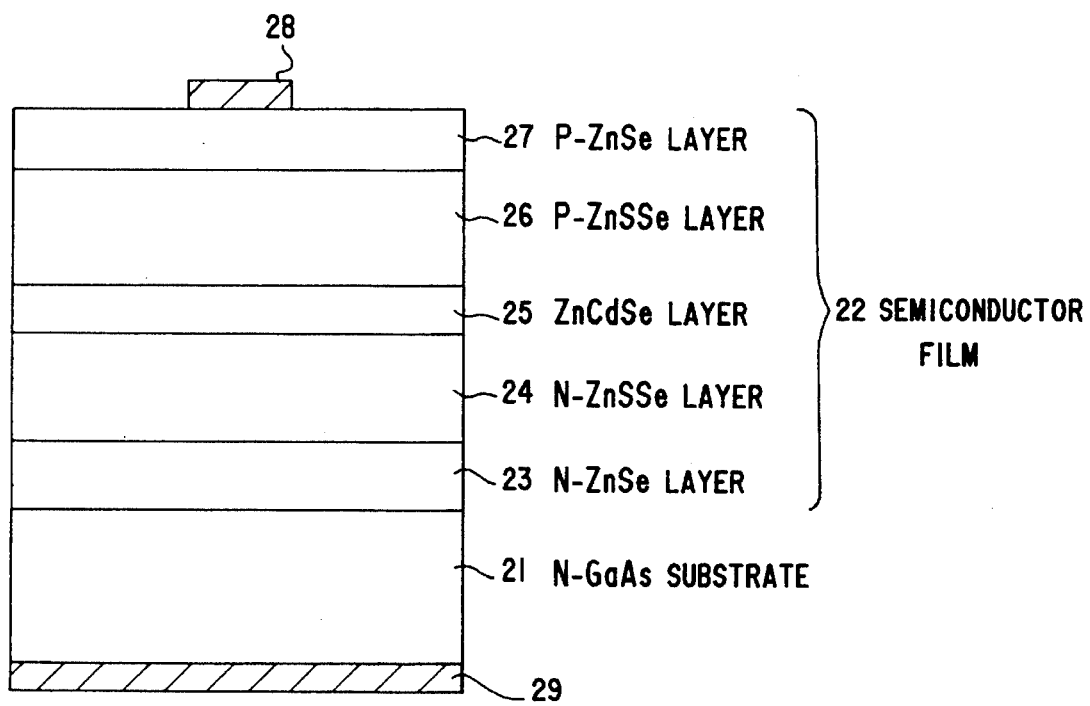
FIG. 2 is a front cross-sectional view schematically showing the structure of a conventional semiconductor laser device.
Figure 3:
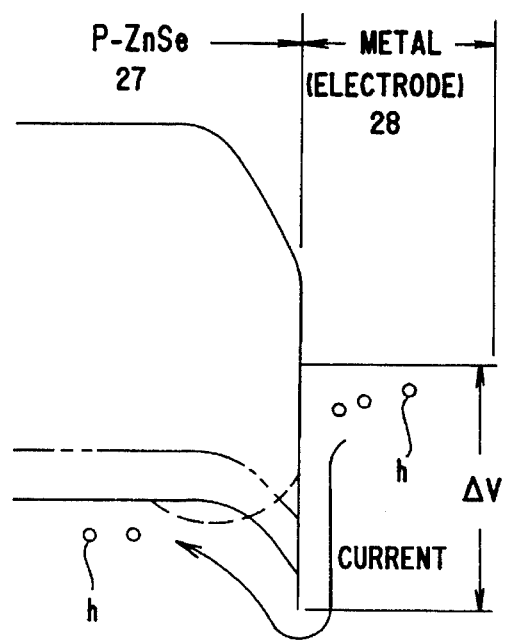
FIG. 3 is a characteristic diagram showing the energy band at the connection between a positive electrode and a semiconductor in the conventional semiconductor laser device.

The sum of the differences $\Delta V_1$ to $\Delta V_3$ is substantially equal to the potential difference $\Delta V$ between the electrodes 28 and the P-type ZnSe layer 27 of the conventional structure of FIG. 2. However, the quantity of current flowing through the P-N junction structure between the positive and negative electrodes 12 and 13 decreases exponentially with respect to the height of the energy barrier.

Figure 7:
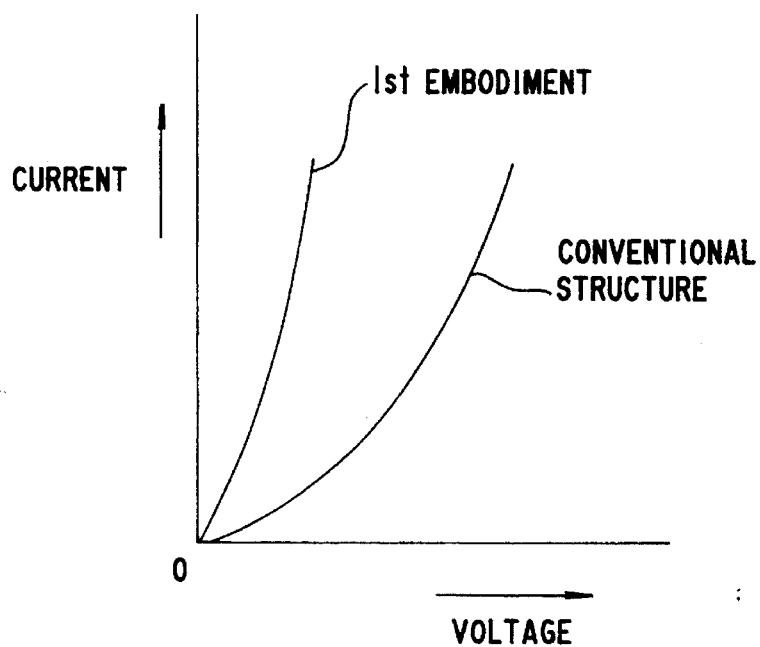
FIG. 7 shows the voltage/current characteristics of the first embodiment and the conventional device for comparison.

FIG. 7 shows the voltage/current characteristics of this embodiment and the conventional structure. As is obvious from the figure, in this embodiment, even though the potential differences of the energy barriers are the same, the voltage necessary to obtain a current which causes the holes h to go over the energy barrier between the positive electrode 12 and the P-type ZnSe layer 7 is very low compared to the conventional structure.

Subsequently, a method will be described of manufacturing a semiconductor laser device of the above-described structure. First, on the N-type GaAs substrate 1 which is set at a predetermined substrate temperature of 350° C. or below, the N-type ZnSe layer 3, the N-type ZnSSe layer 4, the ZnCdSe layer 5, the P-type ZnSSe layer 6 and the P-type ZnSe layer 7 which constitute the group II–VI semiconductor film 2 of ZnCdSSe are formed through MBE growth in this order in lamination.

Then, the P-type interface film 15 is formed on the group II-VI semiconductor film 2. In this case, the substrate temperature is set at a value (e.g. 300° C.) less than or equal to the substrate temperature (i.e. 350° C.) at which the group II–VI semiconductor film 2 is grown. Under this temperature, the P-type AlGaAs film 10 is MBE-grown on the P-type ZnSe layer 7. In this case, the carrier concentration of the P-type AlGaAs film 10 is $10^{19}$ g/cm³ or above.

Then, the P-type GaAs film 11 is MBE-grown on the P-type AlGaAs film 10. In this case, the film thickness of the P-type GaAs film 11 is less than or equal to a critical value, and the carrier concentration thereof is $10^{19}$/cm³ or above like the P-type AlGaAs film 10. The substrate temperature is also set lower than or equal to the substrate temperature at which the group II–VI semiconductor film 2 is grown like at the time of the growth of the P-type AlGaAs film 10.

By setting the growth temperature of the P-type AlGaAs film 10 and the P-type GaAs film 11 lower than or equal to the growth temperature of the group II–VI semiconductor film 2 of ZnCdSSe, the generation of a highly electrically resistant alloy layer due to the diffusion of the P-type AlGaAs film 10 and the P-type GaAs film 11 into the P-type ZnSe layer 7 is prevented, so that the deterioration of the P-type ZnSe layer 7 is prevented. In addition, by increasing the carrier concentration, the current flows more easily.

After the P-type GaAs film 11 is formed on the P-type AlGaAs film 10, a metal such as Au is deposited onto the P-type GaAs film 11 to form the positive electrode 12. Then, unnecessary portions of the positive electrode 12, the P-type GaAs film 11 and the P-type AlGaAs film 10 are removed by a method such as etching to form the P-type AlGaAs film 10, the P-type GaAs film 11 and the positive electrode 12 in a belt shape as shown in FIG. 5.

While the semiconductor film 2 is made of a group II–VI semiconductor of ZnCdSSe in this embodiment, the same workings and advantages are obtained when the semiconductor film 2 is made of a group II–VI semiconductor of MgZnCdSSe.

Figure 8:
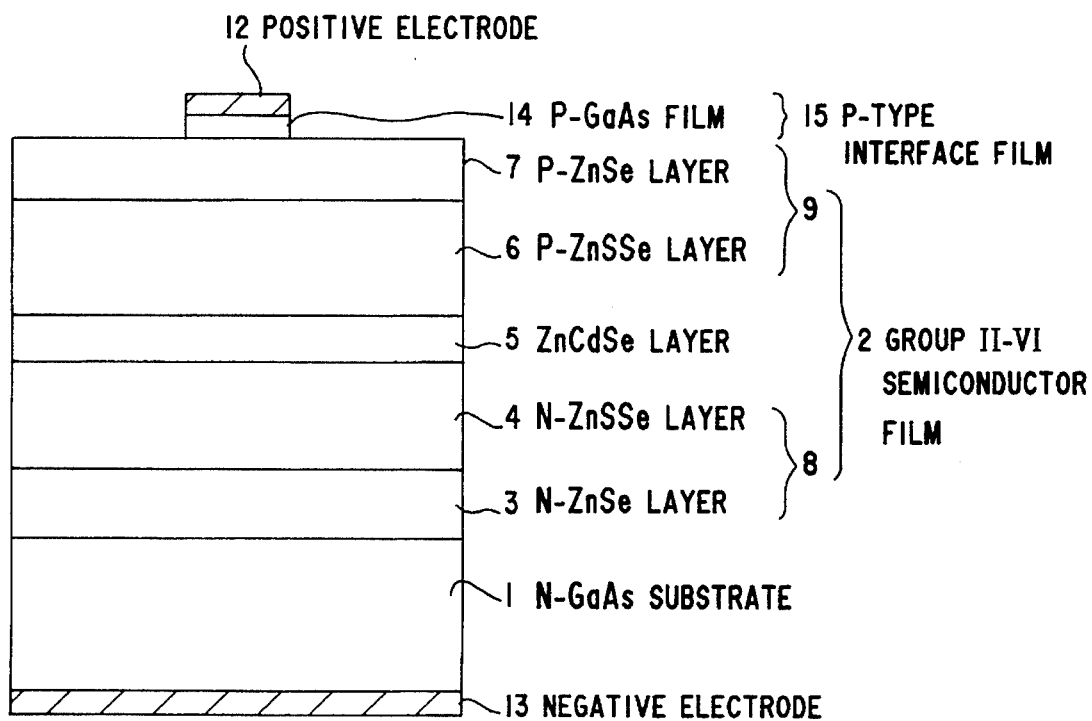
FIG. 8 is a front cross-sectional view schematically showing the structure of a second embodiment of the present invention.

FIG. 8 shows the structure of a second embodiment of the present invention. In this device, the P-type interface film 15 of the first embodiment is replaced by a film including one layer. In FIG. 8, the same elements as those of the first embodiment are denoted by the same reference designations and no description thereof are given.

In this structure, between the positive electrode 12 and the P-type ZnSe layer 7 which is the top layer of the group II–VI semiconductor film 2, a P-type GaAs film 14 is provided as the P-type interface film 15. While the positive electrode 12 and the P-type GaAs film 14 are formed to be of a belt shape to prevent the current diffusion like in the first embodiment, they may be of another shape.

Figure 9:
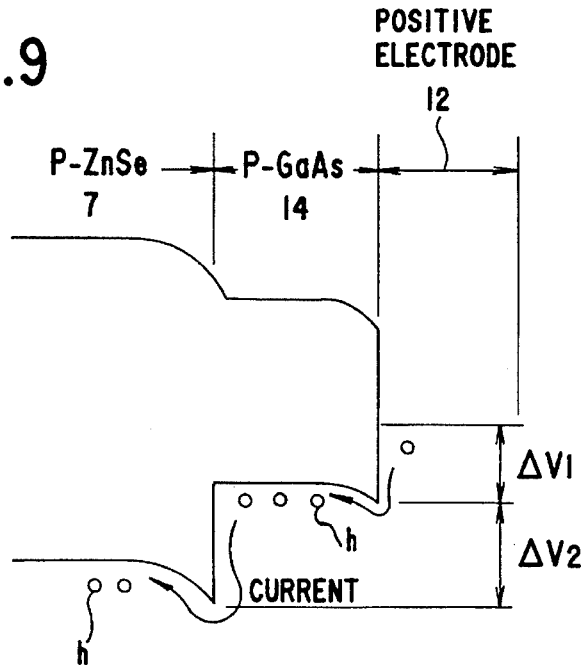
FIG. 9 is a characteristic diagram showing the energy band at the connection between a positive electrode and a semiconductor in the second embodiment.

FIG. 9 shows the condition of the energy band in this structure. The energy gap of each layer compared to the positive electrode 12 increases in the following order: the P-type GaAs film 14<the P-type ZnSe layer 7 of the group II–VI semiconductor film 2. Therefore, the energy barrier from the positive electrode to the P-type ZnSe layer 7 is divided into two steps. The potential differences are $\Delta V_1$ between the positive electrode 12 and the P-type GaAs film 14 and $\Delta V_2$ between the P-type GaAs film 14 and the P-type ZnSe layer 7. The sum of $\Delta V_1$ and $\Delta V_2$ is substantially equal to the potential difference $\Delta V$ between the positive electrode 28 and the P-type ZnSe layer 27 of the conventional structure shown in FIG. 2.

Figure 1:
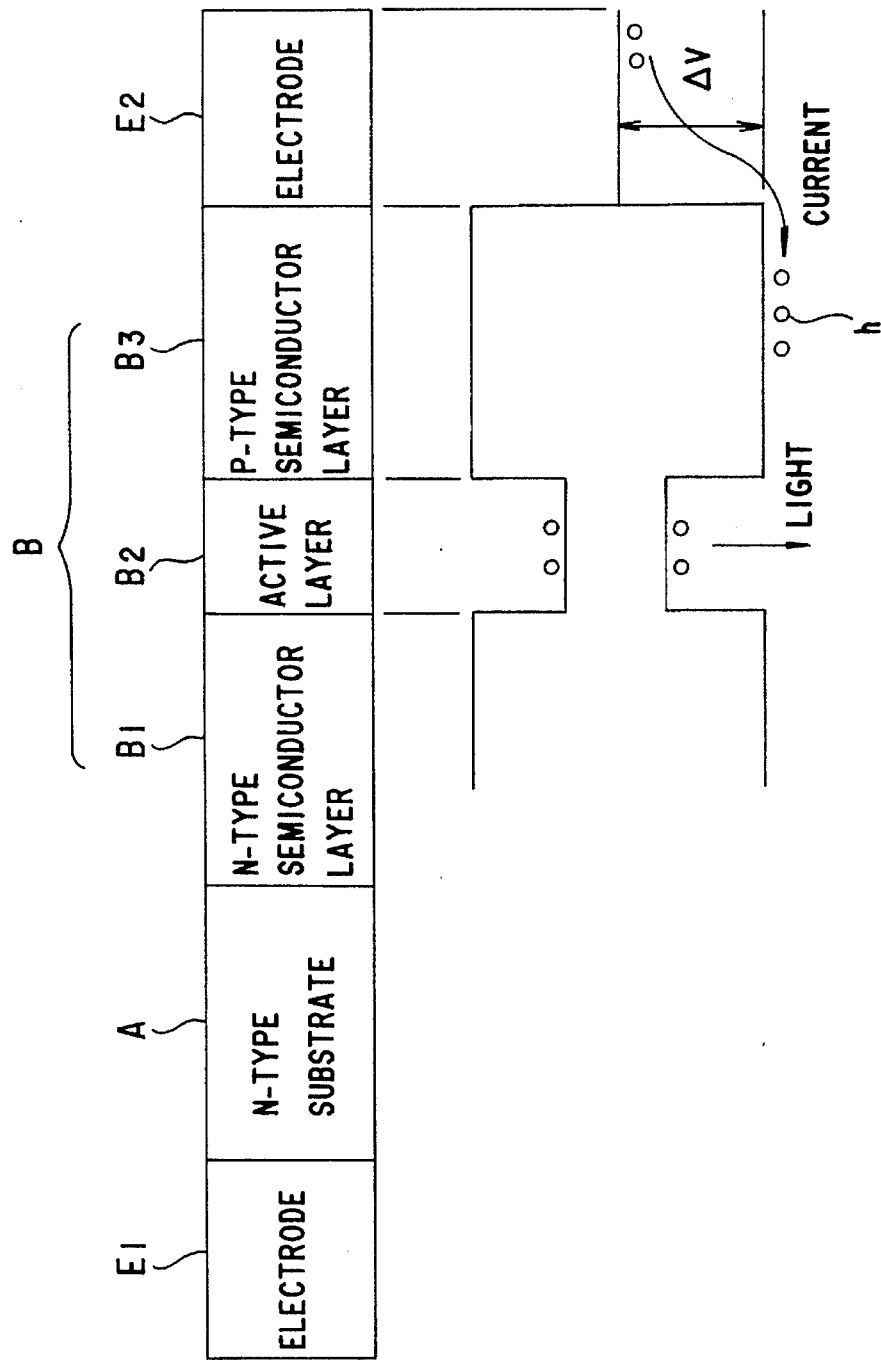
FIG. 1 schematically shows the correspondence between a conventional structure and its energy band.

With this structure, a voltage/current characteristic similar to that of the first embodiment shown in FIG. 1 is obtained. As a result, the voltage is much lower which is necessary to obtain a current which causes the holes h to go over the energy barrier between the positive electrode 12 and the P-type ZnSe layer 7.

The semiconductor laser device according to this embodiment is manufactured in substantially the same method as the first embodiment. First, the group II–VI semiconductor film 2 is formed on the N-type GaAs substrate 1 by the method described previously. Then, at a substrate temperature lower than or equal to the substrate temperature at which the group II–VI semiconductor film is grown, the P-type GaAs film 14 is MBE-grown on the P-type ZnSe layer 7 as the P-type interface film 15. In this case, the carrier concentration of the P-type GaAs film 14 is $10^{19}/cm^3$ or above. Then, a metal such as Au is deposited onto the P-type GaAs film 14 to form the positive electrode 12, and unnecessary portions of the positive electrode 12 and the P-type GaAs film 14 are removed by a method such as etching.

While the semiconductor film 2 is made of a group II–VI semiconductor of ZnCdSSe in this embodiment, the same workings and advantages are obtained when the semiconductor film 2 is made of a group II–VI semiconductor of MgZnCdSSe. Moreover, instead of the P-type GaAs film 14, a P-type InGaAs film may be formed in a similar manner to the P-type interface film 15.

As described above, according to the semiconductor light emitting device of the present invention, by forming the P-type interface layer 15 including one or two layers between the positive electrode 12 and the group II–VI semiconductor film 2 of ZnCdSSe or MgZnCdSSe MBE-grown on the GaAs substrate 1, the energy barrier between the positive electrode 12 and the semiconductor film 2 is divided into steps. With this arrangement, even though the potential differences of the energy barriers are the same, the voltage necessary to obtain a current which causes the holes h to go over the energy barrier between the positive electrode 12 and the P-type semiconductor layer 9 is very low compared to the conventional structure. As a result, the generation of heat is decreased and the temperature characteristic of the whole semiconductor light emitting device is improved. In addition, the deterioration speed of the device is restrained to prolong the life of the device.

Moreover, the interface film, which can be formed to have a carrier concentration of $10^{19}/cm^3$ or above, is very useful to realize a structure where the current flows more easily, under the circumstances where it is impossible to obtain a P-type group II–VI semiconductor film having such a high carrier concentration. A semiconductor device having a larger current at a lower voltage can be produced through this feature as well as the improved voltage/current characteristic mentioned above.

Further, since the group. II–VI semiconductor film 2 is MBE-grown on the GaAs substrate 1 at a substrate temperature of 350° C. or below, and the P-type interface film 15 is MBE-grown at a substrate temperature lower than or equal to the substrate temperature in the semiconductor film 2 formation, the generation of a highly electrically resistant alloy layer due to the diffusion of the P-type interface film 15 is prevented. As a result, the deterioration of the group II–VI semiconductor film is prevented.

Obviously, many modifications and variations of the present invention are possible in light of the above teachings. It is therefore to be understood that within the scope of the appended claims, the invention may be practiced other than as specifically described.

What is claimed is:

1. A semiconductor light emitting device comprising:

a GaAs substrate;

a semiconductor film including an N-type semiconductor layer, an active layer and a P-type semiconductor layer which are formed in this order in lamination, said semiconductor film being formed so that the N-type semiconductor layer adjoins the GaAs substrate, and wherein said active layer emits light when electrons from said N-type semiconductor layer and holes from said P-type semiconductor layer come thereinto;

a P-type interface film having an energy band lower than an energy band of the P-type semiconductor layer, said P-type interface film being formed of two P-type films and on the P-type semiconductor layer of the semiconductor film; and a positive electrode formed on the P-type interface film.

2. A semiconductor light emitting device according to claim 1, wherein said semiconductor film is a group II–VI semiconductor comprising Zn, Cd, S and Se.

3. A semiconductor light emitting device according to claim 1, wherein said semiconductor film is a group II–VI semiconductor comprising Mg, Zn Cd, S and Se.

4. A semiconductor light emitting device according to claim 1, wherein said two P-type films forming said P-type interface film are a P-type AlGaAs film and a P-type GaAs film.

5. A semiconductor light emitting device according to claim 1, wherein said two P-type films forming said P-type interface film are a P-type GaAs film and a P-type InGaAs film.

6. A semiconductor light emitting device according to claim 1, wherein a carrier concentration of said P-type interface film is at least $10^{19}/cm^3$.

* * * * *